United States Patent
Machado et al.

(10) Patent No.: US 8,591,720 B2
(45) Date of Patent: Nov. 26, 2013

(54) METHOD AND APPARATUS FOR ACHIEVING MAXIMUM YIELD IN THE ELECTROLYTIC PREPARATION OF GROUP IV AND V HYDRIDES

(75) Inventors: Reinaldo Mario Machado, Allentown, PA (US); Christopher L. Hartz, Slatington, PA (US); James E. Hollen, Pottstown, PA (US); Rebecca J. Mohr, Allentown, PA (US); George L. Ryals, Newton, NJ (US)

(73) Assignee: Air Products and Chemicals, Inc., Allentown, PA (US)

( * ) Notice: Subject to any disclaimer, the term of this patent is extended or adjusted under 35 U.S.C. 154(b) by 79 days.

(21) Appl. No.: 13/208,418

(22) Filed: Aug. 12, 2011

(65) Prior Publication Data

US 2012/0205252 A1   Aug. 16, 2012

Related U.S. Application Data

(62) Division of application No. 11/687,947, filed on Mar. 19, 2007, now Pat. No. 8,021,536.

(60) Provisional application No. 60/791,840, filed on Apr. 13, 2006.

(51) Int. Cl.
　　*C25B 7/00*　　(2006.01)
　　*C25B 1/00*　　(2006.01)
　　*C25B 1/20*　　(2006.01)

(52) U.S. Cl.
　　USPC ............................ 205/477; 205/334

(58) Field of Classification Search
　　USPC .......................... 205/477, 334
　　See application file for complete search history.

(56) References Cited

U.S. PATENT DOCUMENTS

| | | | |
|---|---|---|---|
| 4,178,224 | A | 12/1979 | Porter |
| 5,158,656 | A | 10/1992 | Ayers |
| 5,425,857 | A | 6/1995 | Bouard et al. |
| 5,474,659 | A | 12/1995 | Cadet |
| 5,925,232 | A | 7/1999 | Ayers |
| 6,080,297 | A | 6/2000 | Ayers |

FOREIGN PATENT DOCUMENTS

| | | |
|---|---|---|
| JP | 01-139781 A | 6/1989 |
| JP | 07-180076 A | 7/1995 |
| JP | 2000-501783 A | 2/2000 |
| WO | 97/20965 A1 | 6/1997 |
| WO | 2005/005673 A2 | 1/2005 |

*Primary Examiner* — Harry D Wilkins, III
*Assistant Examiner* — Zulmariam Mendez
(74) *Attorney, Agent, or Firm* — Lina Yang

(57) ABSTRACT

A method for generating hydride gas of metal $M_1$ in electrochemical cell comprising cathode comprising metal $M_1$, sacrificial anode comprising metal $M_2$, an initial concentration of aqueous electrolyte solution comprising metal hydroxide $M_3OH$, wherein the sacrificial metal anode electrochemically oxidizes in the presence of the aqueous electrolyte solution to form metal salt, and hydride gas of metal $M_1$ is formed by reducing the metal $M_1$ of the cathode. The method also comprises steps of determining solubility profile curves of metal salt as $M_3OH$ is consumed and metal oxide is formed by oxidation reaction at various concentrations of $M_3OH$; determining the maximum concentration of $M_3OH$ that does not yield a concentration of metal salt that precipitates out of the electrolyte solution; and choosing a concentration of $M_3OH$ that is in the range of at and within 5% less than the maximum concentration of $M_3OH$ to be the initial concentration of $M_3OH$.

2 Claims, 4 Drawing Sheets

US 8,591,720 B2

METHOD AND APPARATUS FOR ACHIEVING MAXIMUM YIELD IN THE ELECTROLYTIC PREPARATION OF GROUP IV AND V HYDRIDES

CROSS-REFERENCE TO RELATED APPLICATIONS

This application is a divisional patent application of U.S. patent application Ser. No. 11/687,947, filed on Mar. 19, 2007, the disclosure of which is incorporated herein by reference in its entirety. This application also claims the benefit of priority under 35 U.S.C. §119(e) to earlier filed U.S. Provisional Application 60/791,840, filed Apr. 13, 2006 titled. The disclosure of this provisional application is hereby incorporated by reference.

BACKGROUND OF THE INVENTION

This invention is in the field of electrochemical processes and apparatus. More specifically, the present invention is directed to the electrochemical synthesis and production of Group IV and V volatile hydrides, and a reactor for carrying out the synthesis. The synthesis and the reactor are designed to more efficiently produce high purity hydrides.

High purity gases are required for semiconductor fabrication and doping. Often these gases are dangerously toxic. Commercial compressed gas cylinders store gas at several thousand pounds per square inch pressure and contain one to ten pounds of gas. Hence, centralized production, transportation and storage of these materials presents a hazard to those working with them.

To avoid these hazards, an apparatus has been developed to provide these dangerous gases to be generated only when they are needed such as, for example, at a chemical vapor deposition reactor in a semiconductor manufacturing plant. For example, W. M. Ayers, in U.S. Pat. Nos. 5,158,656 and 6,080,297, describes an electrochemical apparatus and method for supplying volatile hydrides at the proper pressure for introduction into a chemical vapor deposition reactor. Such processes generate metal hydride gas and hydrogen gas from the corresponding metal cathode by employing a sacrificial anode (i.e., an electrode that corrodes to an oxide) and hydroxide-based electrolytes in an undivided electrochemical cell. Such processes, however, do not operate efficiently due to the uncontrolled formation of solid precipitates that are a byproduct of the electrochemical reaction that occurs within the apparatus. The precipitation of these solids has a negative effect on the overall yield and quality of the electrochemically generated hydride gas.

Porter, in U.S. Pat. No. 4,178,224, discloses an electrochemical method for the synthesis of arsine gas that utilizes a dissolved arsenic salt with an oxygen evolving anode. With this method, however, the arsine concentration was limited to less than 25%. Another limitation of Porter's method was the need to balance pressures and liquid levels in the divided anode and cathode sections of the electrochemical cell. This requires an inert gas supply to the cell.

U.S. Pat. Nos. 5,427,659, and 5,474,659, disclose the electrochemical generation of hydride gases with aqueous electrolytes under conditions that avoid oxygen formation. Although these methods also avoid the formation of solid precipitates, the hydride yield is much lower than desired.

Thus, while efforts have continued to provide effective means for producing and delivering hydride gases, there is still a need in the art to improve the quality and quantity of delivered hydride gas product streams.

BRIEF SUMMARY OF THE INVENTION

The present invention satisfies this need by providing a method for generating a hydride gas of metal $M_1$ in an electrochemical cell comprising a cathode comprising metal $M_1$; a sacrificial anode comprising metal $M_2$; an initial concentration of aqueous electrolyte solution comprising a metal hydroxide, $M_3OH$, wherein the sacrificial metal anode electrochemically oxidizes in the presence of the aqueous electrolyte solution comprising $M_3OH$ to form a metal salt, and the hydride gas of metal $M_1$ is formed by reducing the metal $M_1$ of the cathode, the method comprising the steps of: determining a solubility profile curve of the metal salt as the $M_3OH$ is consumed and the metal oxide is formed by the oxidation reaction at various concentrations of $M_3OH$; determining a maximum concentration of $M_3OH$ that, as it is consumed, does not yield a concentration of metal salt that precipitates out of the electrolyte solution; and choosing a concentration of $M_3OH$ that is in the range of at and within 5% less than the maximum concentration of $M_3OH$ to be an initial concentration of $M_3OH$.

DETAILED DESCRIPTION OF THE INVENTION

The present invention provides a method for the production of very high purity gases such as, for example, hydride gases and the feed of gas product streams including such gases at constant composition over extended periods of time.

In one aspect, the present invention provides a method for generating a hydride gas of metal $M_1$ in an electrochemical cell comprising a cathode comprising metal $M_1$, a sacrificial anode comprising metal $M_2$, and an initial concentration of aqueous electrolyte solution comprising a metal hydroxide $M_3OH$, wherein the sacrificial metal anode electrochemically oxidizes in the presence of the aqueous electrolyte solution comprising $M_3OH$ to form a metal salt, and the hydride gas of metal $M_1$ is formed by reducing the metal $M_1$ of the cathode. The method comprises the steps of determining solubility profile curves of the metal salt as the $M_3OH$ is consumed and the metal oxide is formed by the oxidation reaction at various concentrations of $M_3OH$; determining a maximum concentration of $M_3OH$ that, as it is consumed, does not yield a concentration of metal salt that precipitates out of the electrolyte solution; and choosing a concentration of $M_3OH$ that is at and within 5% less than the maximum concentration of $M_3OH$ to be the initial concentration of $M_3OH$.

Figure 1:
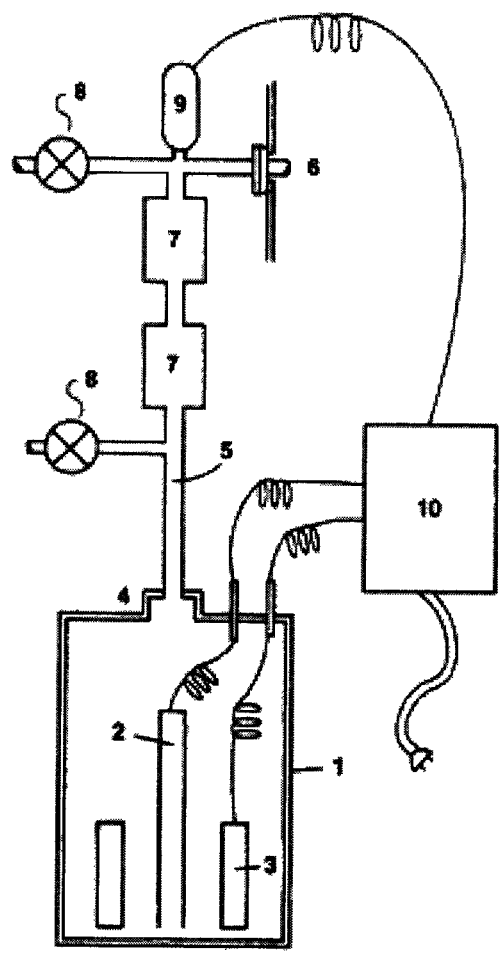
FIG. 1 shows the reactor diagrammatically and in cross-section used for the present invention (not a part of this invention).

FIG. 1 shows an electrochemical reactor used for the present invention (not a part of this invention). The details of the electrochemical reactor are discussed in U.S. Pat. No. 5,158,656, and the detailed discussions are hereby incorporated by reference. The electrochemical reactor comprises a pressure vessel 1. Pressure vessel 1 is preferably lined with an unreactive material like Teflon™. Inside the reactor is an electrolytic cell having a cathode 2 comprising metal $M_1$ and sacrificial anode 3 comprising metal $M_2$. The pressure vessel is connected through port 4 and manifold 5 to the inlet of CVR 6, in which hydride gases of metal $M_1$ are used, for example, to manufacture, and for doping, semiconductors.

Suitable cathode materials, $M_1$, for use in the invention include, for instance, those which contain Sb, As, Se (to make hydrogen selenide), P, Ge, Zn, Pb, Cd and alloys thereof such as, for example, lead arsenic. Suitable anode materials, $M_2$, include, for example, those containing molybdenum, tungsten, vanadium, cadmium, lead, nickel hydroxide, chromium, antimony, arsenic and alloys thereof and generally hydrogen oxidation anodes. A redox anode material may also be used, for example including $MnO_2/MnO_3$, $Fe(OH)_2/Fe_3O_4$, $Ag_2O/Ag_2O_2$, or $Co(OH)_3/Co(OH)_2$. In addition, soluble, oxidizible ionic species with an oxidation potential less than 0.4 volts versus an Hg/HgO reference electrode can be used as anodes in embodiments of the present invention as disclosed herein.

Illustrative aqueous electrolytes comprising $M_3OH$ that can be used in the present invention are those in which $M_3$ is selected from the group consisting of alkali or alkaline earth metals. Examples of aqueous electrolytes comprising $M_3OH$ include, e.g., NaOH, KOH, LiOH, CsOH, $NH_4OH$ and combinations thereof. Water, deuterated water ($D_2O$) and mixtures thereof may be used in the electrolytes.

A product of the electrochemical reaction at the sacrificial anode is the formation of a metal salt of the metal $M_2$ from which the anode is made. Such metal salts may include metal oxide salts, metal halide salts, metal nitrate salts, metal sulfate salts or mixtures thereof, depending upon the composition of the anode and the electrolyte. For example, in one embodiment, arsine (a hydride of arsenic metal) is produced by employing a cathode comprising arsenic and a sacrificial anode comprising molybdenum in an electrolyte solution comprising potassium hydroxide. In this embodiment, the following electrochemical oxidation reaction occurs:

$$Mo + 2KOH + 2H_2O \rightarrow 6e^- + K_2MoO_4 + 6H^+$$

The formation of arsine occurs according to the following electrochemical reduction reaction at the arsenic cathode, $$2As + 6H_2O + 6e^- \rightarrow 2AsH_3 + 6OH^-$$

Each mole of hydroxide consumed can theoretically produce one mole of arsine. In an electrochemical cell with limited volume one would anticipate, based on stoichiometry alone, that the highest concentration of a liquid potassium hydroxide aqueous solution should generate the highest amount of arsine. This however is not the case.

In practice, however, if one chooses an initial concentration of potassium hydroxide that, theoretically, should produce the highest amount of arsine based upon stoichiometry, solid crystals of potassium molybdate are formed as the process proceeds. The formation of solid metal salts prevents proper current distribution and operation of the cell limiting the purity and the yield. On the other hand, if one chooses a low concentration of potassium hydroxide then solids will not be formed but the ultimate yield of the cell to produce arsine will be limited. Both high and low concentrations of the potassium hydroxide limit the production of arsine in this example. By the method of the present invention, yield and purity of the generated hydride gas are surprisingly higher and operating voltages are stable under operating conditions where a high concentration of hydroxide electrolyte is used so that the reaction products of the anode oxidation process are soluble and do not form solids that precipitate in the electrolyte.

Figure 2:
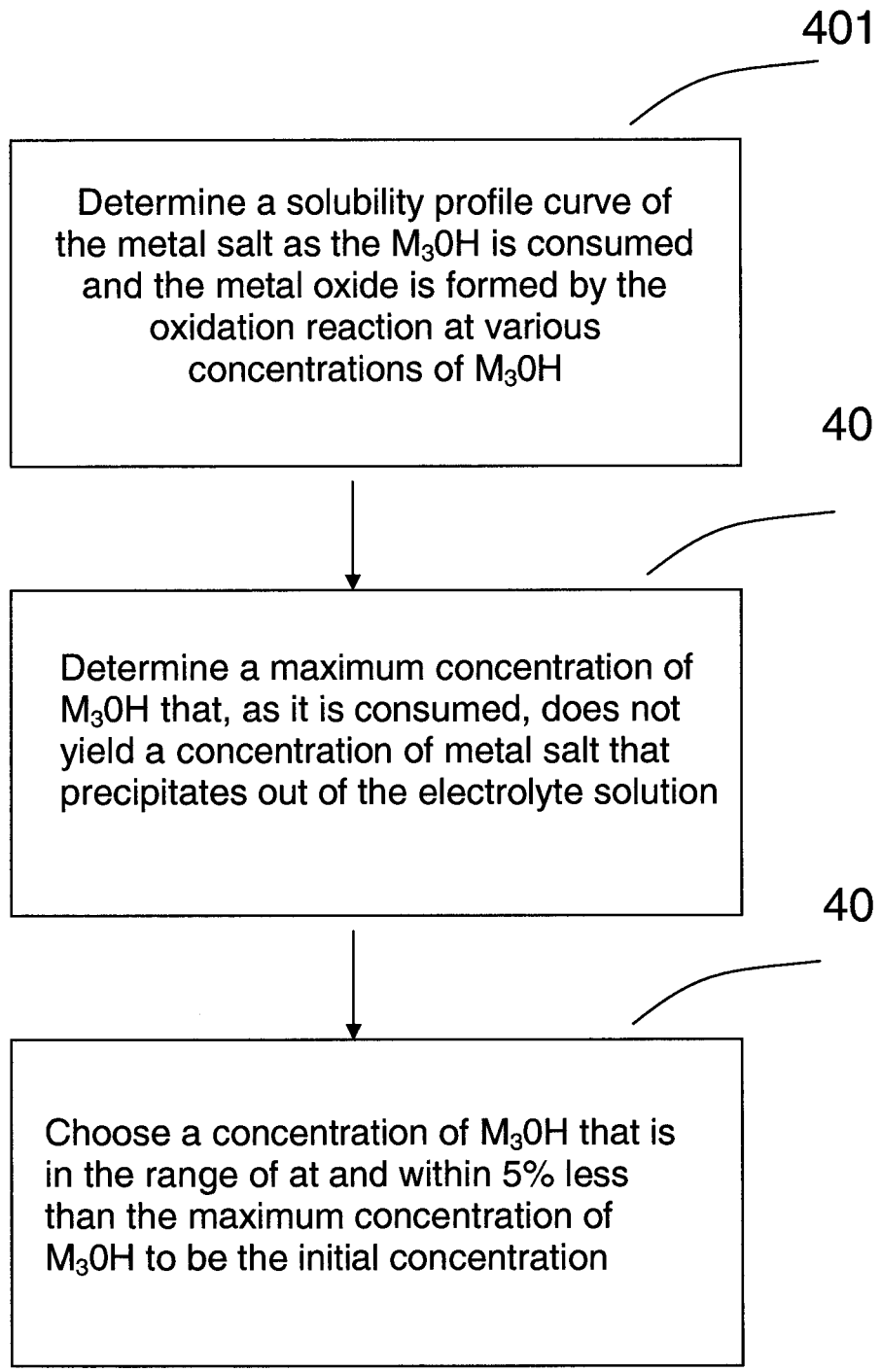
FIG. 2 is a flow chart of a method according to the present invention.

Referring now to FIG. 2, the method of the present invention comprises the steps of 401 determining a solubility profile curve of the metal salt as the $M_3OH$ is consumed and the metal oxide is formed by the oxidation reaction at various concentrations of $M_3OH$; 402 determining a maximum concentration of $M_3OH$ that, as it is consumed, does not yield a concentration of metal salt that precipitates out of the electrolyte solution; and 403 choosing a concentration of $M_3OH$ that is in the range of at and within 5% less than the maximum concentration of $M_3OH$ to be the initial concentration of $M_3OH$.

Although the following method of the present invention will now be described by employing a cathode comprising arsenic and a sacrificial anode comprising molybdenum in an electrolyte solution comprising potassium hydroxide, one of ordinary skill in the art would understand the broad applicability of the present invention as it may be used with other cathode materials $M_1$, anode materials $M_2$, and electrolyte solutions comprising $M_3OH$ such as, for example, those mentioned above.

Step 401, determining a solubility profile curve of the metal salt as the $M_3OH$ is consumed and the metal oxide is formed by the oxidation reaction at various concentrations of $M_3OH$, is preferably carried out by preparing a solubility profile curve for the metal salt comprising the metal, $M_2$, from the anode. To prepare a solubility profile curve, it is preferred that a series of solubility studies is conducted to simulate the compositions of the electrolyte during various stages of electrolysis. The solubility studies are preferably guided by the following three fundamental electrochemical reactions that describe the observed behavior of the electrochemical generation of hydrides.

As an example, the reactions can involve a sacrificial anode, $M_2$, and an arsenic cathode in a KOH electrolyte:
Anode Oxidation Reaction:

$$M_2 + 2(n-m)OH^- \rightarrow M_2O_{(n-m)}{}^{(n-2m)-} + ne^- + (n-m)H_2O \qquad \text{Equation 1}$$

where m and n are stoichiometric coefficients which depend on the nature of the sacrificial anode metal $M_2$.
Cathode Reduction Reaction to Make Arsine (Hydride):

$$As + 3H_2O + 3e^- \rightarrow AsH_3 + 3OH^- \qquad \text{Equation 2}$$

Cathode Reduction Reaction to Make Hydrogen:

$$2H_2O + 2e^- \rightarrow H_2 + 2OH^- \qquad \text{Equation 3}$$

From these electrochemical mass balance equations one can predict the amount of KOH consumed and the amount of the sacrificial metal salt, $M_2O_{(n-m)}{}^{(n-2m)-}$, that is produced. If the sacrificial metal used is molybdenum the n=6 and m=2 and $M_2O_{(n-m)}{}^{(n-2m)-} = MoO_4{}^{2-}$. In a KOH solution with a molybdenum anode the salt produced is $K_2MoO_4$. Each mole of $K_2MoO_4$ produced will consume 2 moles of KOH and 2 moles of water according to the above equations. This allows one to simulate the composition of the electrolyte as KOH is consumed.

Therefore, to determine the solubility profile curve of the metal salt as the $M_3OH$ is consumed and the metal oxide is formed by the oxidation reaction at various concentrations of $M_3OH$, a series of aqueous solutions at 25° C. were prepared using KOH, water and $K_2MoO_4$ to simulate compositions of the electrolyte corresponding to the electrochemical reactions listed above. The KOH, water and $K_2MoO_4$ were combined and mixed using a magnetic stir-bar and a magnetic stirrer in a sealed polyethylene bottle for 24 hours at 25° C. The liquid phase was separated from the solid phase by filtration. The liquid phase was weighed and the compositions of the liquid and solid phases were determined using Inductively-Coupled-Plasma-Atomic-Emission-Spectroscopy, ICP-AES. The compositions and results are illustrated in Table 1 and Table 2, for KOH concentrations of 45% and 38%, respectively.

Figure 3:
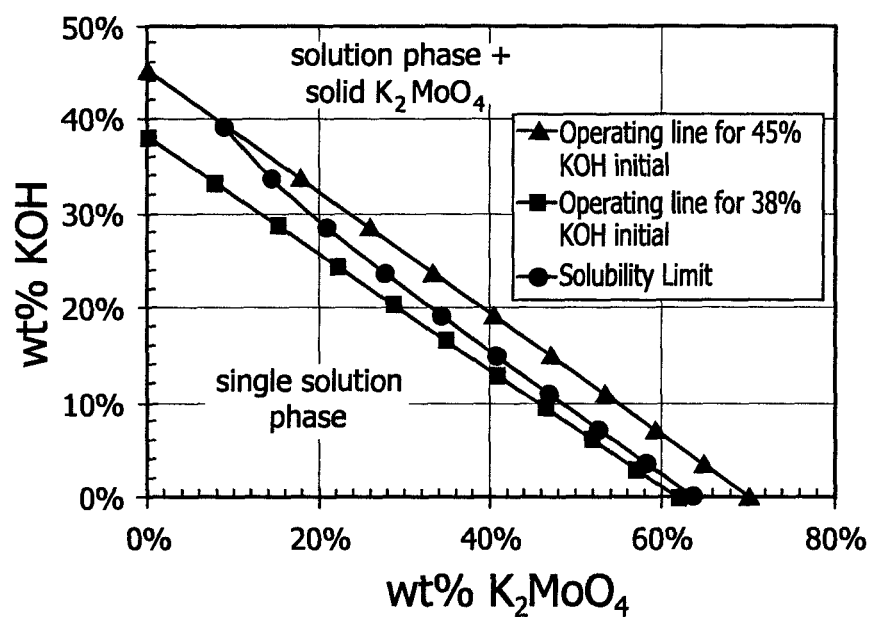
FIG. 3 is a graph illustrating solubility profile curves according to a preferred embodiment of the present invention.

FIG. 3 graphically depicts the solubility profile curves that represent the data provided by Table 1. Referring to FIG. 3, the percent of the metal salt in solution is plotted as a function of the decreasing amount of KOH when the initial concentration of KOH was 45%. Table 2 confirms that, at an initial KOH concentration of 38%, metal salt precipitate was avoided. Different systems with different electrodes and electrolytes can be examined using the same methodology to identify regions where solids will not precipitate.

Step 402, i.e., determining a maximum concentration of $M_3OH$ that, as it is consumed, does not yield a concentration of metal salt that precipitates out of the electrolyte solution, is preferably performed after the solubility profile curve (step 401) is determined because the solubility profile curve preferably serves as a guide in determining the maximum concentration of $M_3OH$. Preferably, step 402 is accomplished by determining operating lines on the solubility profile curve.

In a preferred method of determining an operating line, an electrochemical test cell is constructed with a sacrificial anode of choice, metal or metal alloy $M_2$ and the cathode metal or metal alloy $M_1$. Typically the anode and the cathode are separated by 1 to 10 cm in a vertical orientation. The electrolysis cell is sealed and the gas evolved at the cathode is allowed to vent though an opening in the lid of the cell, through a gas mass flow meter, to monitor the quantity of gas evolved, and into an analytical instrument which can characterize the gas composition. Typical gas analysis instruments suitable for this are infrared analyzers, mass spectrometers and time-of-flight analyzers.

TABLE 1

Experimental solubility study to determine the initial composition of electrolyte to avoid solids
Relationship between KOH and $K_2MoO_4$: Each mole of $K_2MoO_4$ produced, consumes 2 moles of KOH and 2 moles of $H_2O$
Experimental design simulating the net composition of electrolyte during electrolysis: 45% KOH and molybdenum electrode

| | | | | | | | | | | | |
|---|---|---|---|---|---|---|---|---|---|---|---|
| KOH (grams dry basis) | 8.1 | 7.3 | 6.5 | 5.7 | 4.9 | 4.1 | 3.2 | 2.4 | 1.6 | 0.8 | 0.0 |
| $K_2MoO_4$ (grams) | 0.0 | 1.7 | 3.4 | 5.2 | 6.9 | 8.6 | 10.3 | 12.0 | 13.8 | 15.5 | 17.2 |
| Water (grams) | 9.9 | 9.6 | 9.4 | 9.1 | 8.9 | 8.6 | 8.3 | 8.1 | 7.8 | 7.6 | 7.3 |
| Total (grams) | 18.0 | 18.6 | 19.3 | 19.9 | 20.6 | 21.2 | 21.9 | 22.5 | 23.2 | 23.8 | 24.5 |
| net KOH (wt %) | 45.0 | 39.1 | 33.6 | 28.4 | 23.6 | 19.1 | 14.8 | 10.8 | 7.0 | 3.4 | 0.0 |
| net $K_2MoO_4$ (wt %) | 0.0 | 9.2 | 17.8 | 25.9 | 33.4 | 40.5 | 47.1 | 53.4 | 59.3 | 64.9 | 70.2 |
| Solids formed on mixing | No | Yes | Yes | Yes | Yes | Yes | Yes | Yes | Yes | Yes | Yes |

Composition of the liquid and solid phase after solids percipitated at 25° C. from compositions simulating a starting point of 45% KOH

| | | | | | | | | | | | |
|---|---|---|---|---|---|---|---|---|---|---|---|
| grams of liquid | 18.0 | 18.6 | 18.5 | 18.7 | 19.0 | 19.3 | 19.6 | 19.8 | 20.0 | 20.0 | 20.1 |
| *wt % KOH in solution | 45.0 | 39.1 | 33.6 | 28.4 | 23.6 | 19.1 | 14.8 | 10.8 | 7.0 | 3.4 | 0.0 |
| *wt % K2MoO4 in solution | 0.0 | 8.8 | 14.4 | 20.9 | 27.7 | 34.4 | 40.8 | 46.9 | 52.7 | 58.2 | 63.6 |
| grams of solid | 0.00 | 0.09 | 0.77 | 1.25 | 1.62 | 1.97 | 2.34 | 2.75 | 3.24 | 3.80 | 4.43 |
| wt % K2MoO4 in solids | None | 100 | 100 | 100 | 100 | 100 | 100 | 100 | 100 | 100 | 100 |

*The compositions of the liquid and solid phase were determined using Inductively coupled plasma Atomic Emission Spectroscopy, ICP-AES.

TABLE 2

Experimental design simulating the net composition of electrolyte during electrolysis: 38% KOH and molybdenum electrode

| | | | | | | | | | | | |
|---|---|---|---|---|---|---|---|---|---|---|---|
| KOH (grams dry basis) | 8.1 | 7.3 | 6.5 | 5.7 | 4.9 | 4.1 | 3.2 | 2.4 | 1.6 | 0.8 | 0.0 |

TABLE 2-continued

Experimental design simulating the net composition of electrolyte during electrolysis: 38% KOH and molybdenum electrode

| | | | | | | | | | | | |
|---|---|---|---|---|---|---|---|---|---|---|---|
| $K_2MoO_4$ (grams) | 0.0 | 1.7 | 3.4 | 5.2 | 6.9 | 8.6 | 10.3 | 12.0 | 13.8 | 15.5 | 17.2 |
| Water (grams) | 13.2 | 13.0 | 12.7 | 12.4 | 12.2 | 11.9 | 11.7 | 11.4 | 11.1 | 10.9 | 10.6 |
| Total (grams) | 21.3 | 22.0 | 22.6 | 23.3 | 23.9 | 24.6 | 25.2 | 25.9 | 26.5 | 27.2 | 27.8 |
| net KOH (wt %) | 38.0 | 33.2 | 28.7 | 24.4 | 20.3 | 16.5 | 12.9 | 9.4 | 6.1 | 3.0 | 0.0 |
| net $K_2MoO_4$ (wt %) | 0.0 | 7.8 | 15.2 | 22.2 | 28.8 | 35.0 | 40.9 | 46.5 | 51.9 | 57.0 | 61.8 |
| Solids formed on mixing | No | No | No | No | No | No | No | No | No | No | No |

A known quantity and concentration of KOH electrolyte is added to the test cell. The test cell is electrically connected to a direct current, DC, constant current power supply with the anode and cathode attached to the positive and negative terminal respectively, of the power supply. Electrolysis is initiated by setting the constant current supply while the quantity of gas and the net charge passed through the system are monitored. At various points during the electrolysis process the current from the power supply is terminated stopping the electrolysis processes. The electrolyte in the cell is mixed or circulated to insure uniformity and both the liquid phase and solid phase are sampled. The solid phase is filtered to remove liquid and the sample is analyzed for composition using typical analytical methods such as atomic absorption, AA, or Inductively coupled plasma Atomic Emission Spectroscopy, ICP-AES. From the composition analysis of the solid and liquid phases and knowledge of the initial electrolyte composition a solubility diagram demarking the solid and solution phase regions can be produced. Likewise the cell operating line can be determined from the overall mass balance.

The initial composition of the electrolyte can be changed and the process repeated to find a composition where solids do not appear, relative to the solubility profile curve of the metal oxide. This is the maximum. Referring again to FIG. 3, operating lines are shown for a cell having an initial concentration of 45% KOH and for a cell having an initial concentration of 38% KOH. As predicted in the experimental design of Table 2, precipitate was not observed during operation of the cell.

Step 403 of the method is choosing a concentration of $M_3OH$ that is in the range of at and within 5% less than the maximum concentration of $M_3OH$ to be the initial concentration of $M_3OH$. This range typically allows for the most efficient operation of the electrochemical cell, i.e., the highest yield and purity of hydride gas such as, for example, arsine, is generated. Preferably, the mole % of arsenic produced by the method of the present invention is at least 90%, more preferably at least 92%, even more preferably at least 94%, and most preferably at least 95%. Preferably, the % purity of the hydride gas generated over the life of the electrochemical cell according to the present invention is at least 99%, more preferably at least 99.9%, and most preferably at least 99.999%.

EXAMPLES

The following examples are provided for the purpose of further illustrating the present invention but are by no means intended to limit the same.

Experimental Conditions for all Examples Listed in Table 3

Each cell was constructed and operated under similar conditions as illustrated below.

Referring to FIG. 1 again, the anode 3 consisted of four molybdenum plates (99%) with dimensions ⅛"×1.5"×7.5". They were placed in a vertical-lengthwise, symmetric square-pattern (2"×2") around the central cathode rod and connected via a common electrical conducting stainless steel frame. They had a nominal mass of 1000 grams. The conducting frame was located above the electrolyte solution.

The cathode 2 consisted of a single arsenic rod, 1.5" diameter×6" height, was mounted vertically and placed in the center of the square pattern formed by the molybdenum plates. A single ⅛" stainless steel rod was centered within the arsenic rod and extended beyond the top of the arsenic rod to facilitate electrical contact. The cathode had a nominal mass of 1000 grams.

The anodes 3 and cathode 2 were placed in a cylindrical stainless vessel 1 and isolated from the electrically conducting surfaces using polyethylene and Teflon liners and spacers.

The cell was filled with an aqueous solution of potassium hydroxide. The cell was then sealed and electrical contact was made through electrically isolated connections. A single outlet 4 for the gas of the cell was directed to a gas analyzer. A constant current of 2.5 amps was supplied to the electrochemical cell from an external constant current power supply. Gas analysis with a Balzers Pfeiffer QMA-430 Quadrapole Mass Spectrometer confirmed that the principle gases formed in the cell were arsine and hydrogen. The gas formed was also analyzed for composition, using a Lorex Gas Analyzer, Model number PZN-SS-003-4 The mass of arsine produced was confirmed gravimetrically by weighing the electrochemical cell.

Six experiments were performed with various KOH solutions described in Table 3. In each experiment both molybdenum and arsenic were in excess and the limiting chemical reagent was potassium hydroxide, 1 gram of potassium KOH has the potential to generate 1.39 grams of arsine, $AsH_3$.

Examples 1 and 2

High Concentration of Hydroxide

An electrochemical cell was constructed and operated according to the conditions described above. Examples 1 and 2 illustrated in Table 3 were operated with a high concentration of potassium hydroxide (45%). Under these conditions the yield of arsine was 65.7% and 50.0% based on the limiting reagent potassium hydroxide. Inspection of the cell revealed the formation of a large amount of crystals, which substantially filled the space between the anode and cathode.

In Example 1, the purity of the arsenic rod was 99% and the arsine purity was limited to 85% with 15% hydrogen. Increasing the purity of the arsenic to 99.999% increased the gas purity 90% in Example 2.

Examples 3, 4, 5 and 6

Optimal Concentration of Hydroxide

An electrochemical cell was constructed and operated according to the conditions in Example 1. Examples 3, 4 and 5 were operated at high concentrations of potassium hydroxide (39%) which, based on calculations, were just below the saturation curve. Example 6 was operated at high concentrations of potassium hydroxide (38%) which, based on calculations, was just below the saturation curve. Under these conditions the yield of arsine ranged between 71.4% and 77.8% based on the limiting reagent potassium hydroxide compared to Examples 1 and 2. Inspection of the cell revealed that there were no crystals formed.

For the 99% pure arsenic in Example 3 the arsine purity was 92% and when the 99.999% purity arsenic was used in Examples 4, 5 and 6 the arsine purity increased to 94% to however, is not the case. When the system was operated at a hydroxide concentration of 45%, formation of solid precipitate occurred and the arsine yields were limited to from 50.3% to 65.7%. When the hydroxide concentration was kept high, but just below the saturation curve (38% to 39%), solid precipitate did not form and the arsine yields increased to from 71.4% to 77.8%. Operating at high hydroxide concentration, where solids did not form, increased the yield of arsine compared to conditions which formed solids (see Table 3).

For similar arsenic purity the absence of solids allowed the process to generate higher purity arsine gas. When 99% arsenic was used operation with solids generated 85% pure arsine which increased to 90% arsine when the operation did not generate solids. Likewise for 99.999% arsenic, the purity increased from 92% to 95% when the operation shifted from the production of solids to conditions where solids were not produced.

Tables 4 (detailed) and 5 (key results from Table 4) illustrate two important results for a generator which has a limited electrolyte volume of 1 liter. First, the gas quality is improved with lower KOH. Next, an optimum in the yield of Arsine occurs at 39% KOH. At low KOH concentration the amount of arsine is limited to the low levels of KOH no matter how efficient the process is. At high levels of KOH the yield in grams is low because the solids formed in the process interfere with the process.

TABLE 3

| Experiment | Concentration of KOH wt % | Mass of KOH, grams | Arsenic Purity, % over the useful generation life | Mole % Arsine in gas (remainder = hydrogen) | **Yield in grams of arsine. | Theoretical yield based on KOH | Molar Yield of Arsine | Solid crystals covering the cathode |
|---|---|---|---|---|---|---|---|---|
| 1 | 45% | 641 | 99% | 85% | 585 | 890 | 65.7% | Yes |
| 2 | 45% | 638 | 99.999% | 92% | 445 | 886 | 50.3% | Yes |
| 3 | 39% | 681 | 99% | 90% | 675 | 946 | 71.4% | No |
| 4 | 39% | 688 | 99.999% | 95% | 736 | 955 | 77.2% | No |
| 5 | 39% | 704 | 99.999% | 94% | 720 | 978 | 74.6% | No |
| 6 | 38% | 660 | 99.999% | 95% | 714 | 917 | 77.8% | No |

**Note that the yield of arsine was measured at the point where the concentration of arsine dropped sharply to less than 80% purity with increasing production.

TABLE 4

Experiments with limited electrolyte volume

| Experiment | Concentration of KOH wt % | Density, kg/m3 | Mass of KOH, grams | Electrolyte Volume, liters | Arsenic Purity % | Mole % Arsine in gas (remainder = hydrogen) | Theoretical yield based on KOH | Molar Yield of Arsine with KOH as limiting reagent | Solid crystals covering the cathode | Yield in grams of arsine. |
|---|---|---|---|---|---|---|---|---|---|---|
| 7 | 45 | 1457 | 655.7 | 1.00 | 99.999 | 92.0 | 886.0 | 50.3% | Yes | 445.7 |
| 8 | 39 | 1390 | 542.1 | 1.00 | 99.999 | 94.5 | 732.6 | 75.9% | No | 556.0 |
| 9* | 10 | 1092 | 109.2 | 1.00 | 99.999 | 94.5 | 147.6 | 100.0% | No | 147.6 |

*The molar yield of arsine is assumed in this example to be 100%.

Figure 4:
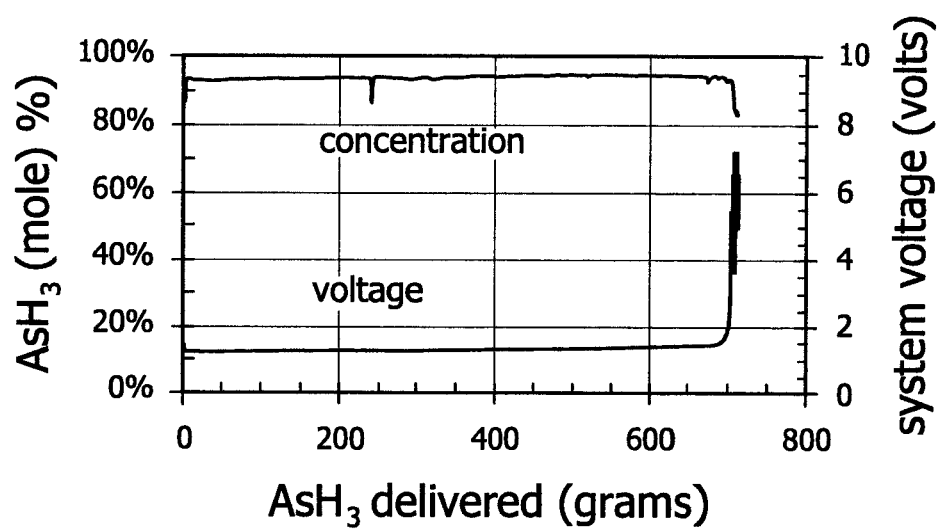
FIG. 4 is a graph illustrating the improved generation of a hydride gas according to the present invention.

95%. FIG. 4 illustrates the improved generation of arsine gas for Example 5 up to the point of failure at 704 grams of arsine produced.

Comparison of Examples 1-6

When the hydroxide solution is the limiting reagent in the electrochemical production of a hydride, one would predict based on stoichiometry that increasing the concentration of the limiting reagent should increase the yield of arsine. This,

TABLE 5

Experiments with 1 liter of KOH electrolyte.

| Experiment | Concentration of KOH wt % | Mole % Arsine in gas (remainder = hydrogen) | Yield in grams of arsine. |
|---|---|---|---|
| 7 | 45% | 92.0% | 445.7 |
| 8 | 39% | 94.5% | 556.0 |
| 9* | 10% | 94.5% | 147.6 |

Examples 7-14 Effect of Excess of Solids from the Anode Reaction

Example 7

An undivided temperature controlled electrochemical cell made of Teflon® will be constructed with an internal volume of 10 cc of liquid. A molybdenum anode (99% purity) with a surface area of 2.8 cm² will be positioned 3.8 cm from an antimony cathode (>99% purity) with a surface area of 2.8 cm². An aqueous electrolyte containing 35% potassium hydroxide will be charged to the cell. An electrical potential of 5.0 V will be applied to the cell while the aqueous electrolyte temperature will be maintained at 0° C. using an external cooling bath. Stibine along with hydrogen will be evolved from the cell. A current ranging from 0.6 to 0.8 amps and a stibine production rate of 0.7 mg/min will be obtained.

Example 8

An undivided temperature controlled electrochemical cell made of Teflon® will be constructed with an internal volume of 10 cc of liquid. A molybdenum anode (99% purity) with a surface area of 2.8 cm² will be positioned 3.8 cm from an antimony cathode (>99% purity) with a surface area of 2.8 cm². An aqueous electrolyte containing 35% potassium hydroxide saturated with potassium molybdate, $K_2MoO_4$, and containing free potassium molybdate solids will be charged to the cell. An electrical potential of 5.0 V will be applied to the cell while the aqueous electrolyte temperature will be maintained at 0° C. using an external cooling bath. Stibine along with hydrogen will be evolved from the cell. A current ranging from 0.05 to 0.10 amps and a stibine production rate of 0.08 mg/min will be obtained.

Example 9

An undivided temperature controlled electrochemical cell made of Teflon® will be constructed with an internal volume of 10 cc of liquid. A tungsten anode (99% purity) with a surface area of 2.8 cm² will be positioned 3.8 cm from an arsenic cathode (>99% purity) with a surface area of 2.8 cm². An aqueous electrolyte containing 35% sodium hydroxide will be charged to the cell. An electrical potential of 5.0 V will be applied to the cell while the aqueous electrolyte temperature will be maintained at 21° C. using an external cooling bath. Arsine along with hydrogen will be evolved from the cell. A current ranging from 1.0 to 1.2 amps and an arsine production rate of 16.0 mg/min will be obtained.

Example 10

An undivided temperature controlled electrochemical cell made of Teflon® will be constructed with an internal volume of 10 cc of liquid. A tungsten anode (99% purity) with a surface area of 2.8 cm² will be positioned 3.8 cm from an arsenic cathode (>99% purity) with a surface area of 2.8 cm². An aqueous electrolyte containing 35% sodium hydroxide saturated with potassium tungstate, $NaWO_4$, and containing free potassium tungstate solids will be charged to the cell. An electrical potential of 5.0 V will be applied to the cell while the aqueous electrolyte temperature will be maintained at 21° C. using an external cooling bath. Arsine along with hydrogen will be evolved from the cell. A current ranging from 0.15 to 0.2 amps and an arsine production rate of 2.5 mg/min will be obtained.

Example 11

An undivided temperature controlled electrochemical cell made of Teflon® will be constructed with an internal volume of 10 cc of liquid. A tungsten anode (99% purity) with a surface area of 2.8 cm² will be positioned 3.8 cm from a black phosphorous cathode (>99% purity) with a surface area of 2.8 cm². An aqueous electrolyte containing 35% potassium hydroxide will be charged to the cell. An electrical potential of 5.0 V will be applied to the cell while the aqueous electrolyte temperature will be maintained at 21° C. using an external cooling bath. Phosphine along with hydrogen will be evolved from the cell. A current ranging from 1.0 to 1.2 amps and a phosphine production rate of 2.0 mg/min will be obtained.

Example 12

An undivided temperature controlled electrochemical cell made of Teflon® will be constructed with an internal volume of 10 cc of liquid. A tungsten anode (99% purity) with a surface area of 2.8 cm² will be positioned 3.8 cm from a black phosphorous cathode (>99% purity) with a surface area of 2.8 cm². An aqueous electrolyte containing 35% potassium hydroxide saturated with potassium tungstate, $K_2WO_4$, and containing free potassium tungstate solids will be charged to the cell. An electrical potential of 5.0 V will be applied to the cell while the aqueous electrolyte temperature will be maintained at 21° C. using an external cooling bath. Phosphine along with hydrogen will be evolved from the cell. A current ranging from 0.15 to 0.2 amps and a phosphine production rate of 0.3 mg/min will be obtained.

Example 13

An undivided temperature controlled electrochemical cell made of Teflon® will be constructed with an internal volume of 10 cc of liquid. A molybdenum anode (99% purity) with a surface area of 2.8 cm² will be positioned 3.8 cm from a germanium, Ge, cathode (>99% purity) with a surface area of 2.8 cm². An aqueous electrolyte containing 35% potassium hydroxide will be charged to the cell. An electrical potential of 5.0 V will be applied to the cell while the aqueous electrolyte temperature will be maintained at 21° C. using an external cooling bath. Germane, $GeH_4$, along with hydrogen will be evolved from the cell. A current ranging from 1.0 to 1.2 amps and a germane production rate of 0.5 mg/min will be obtained.

Example 14

An undivided temperature controlled electrochemical cell made of Teflon® will be constructed with an internal volume of 10 cc of liquid. A molybdenum anode (99% purity) with a surface area of 2.8 cm² will be positioned 3.8 cm from a germanium cathode (>99% purity) with a surface area of 2.8 cm². An aqueous electrolyte containing 35% potassium hydroxide saturated with potassium molybdate, $K_2MoO_4$, and containing free potassium molybdate solids will be charged to the cell. An electrical potential of 5.0 V will be applied to the cell while the aqueous electrolyte temperature will be maintained at 21° C. using an external cooling bath. Germane, $GeH_4$, along with hydrogen will be evolved from the cell. A current ranging from 0.15 to 0.2 amps and a germane production rate of 0.08 mg/min will be obtained.

Examples 7-14 illustrate that a cell operated with an electrolyte with excess of solids from the anode reaction leads to a lower production rates of the hydride gas compared to operation with an electrolyte which will be not saturated with solids.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The invention claimed is:

1. An electrochemical vessel for generating a hydride gas of arsenic metal comprising:
   an electrolyte solution comprising from about 35 to about 39% by weight of KOH;
   a cathode comprising at least 99.0% by weight arsenic; and
   at least one anode comprising molybdenum;
   wherein the cathode and the at least one anode are placed in the electrolyte solution.

2. A method of producing a hydride gas of arsenic metal, characterized by using an electrochemical reactor comprising:
   an electrolyte solution comprising from 35% to 39% by weight of KOH,
   a cathode comprising at least 99.0% by weight arsenic, and
   at least one anode comprising molybdenum,
   wherein the cathode and the at least one anode are placed in the electrolyte solution, and a hydride gas of arsenic metal is generated by electrochemically reducing the cathode in the presence of the electrolyte solution.

* * * * *